United States Patent [19]
Fotouhi

[11] Patent Number: 5,550,495
[45] Date of Patent: Aug. 27, 1996

[54] ALL MOS VOLTAGE TO CURRENT CONVERTER

[75] Inventor: Bahram Fotouhi, Cupertino, Calif.

[73] Assignee: Sierra Semiconductor Corporation, San Jose, Calif.

[21] Appl. No.: 241,720

[22] Filed: May 12, 1994

[51] Int. Cl.⁶ ............................................. H02M 11/00
[52] U.S. Cl. ...................................... 327/103; 327/100
[58] Field of Search ................................. 327/103, 100, 327/80, 81, 375, 579, 538, 540, 541, 543, 545, 546, 355, 403, 404; 323/312, 315; 330/253, 254

[56] References Cited

U.S. PATENT DOCUMENTS

| | | | |
|---|---|---|---|
| 4,388,539 | 6/1983 | Boeke | 307/491 |
| 4,427,903 | 1/1984 | Sugimoto | 307/355 |
| 4,433,371 | 2/1984 | Leuthold | 363/127 |
| 4,675,594 | 6/1987 | Reinke | 323/317 |
| 4,835,487 | 5/1989 | Doyle et al. | 330/277 |
| 4,857,866 | 8/1989 | Tateishi | 331/8 |
| 5,061,907 | 10/1991 | Rasmussen | 331/57 |
| 5,095,284 | 3/1992 | Mead | 330/253 |
| 5,107,227 | 4/1992 | Brooks | 331/8 |
| 5,126,685 | 6/1992 | Platt et al. | 330/85 |
| 5,148,120 | 9/1992 | Kano et al. | 330/264 |
| 5,182,525 | 1/1993 | Theus | 330/253 |
| 5,216,354 | 6/1993 | DeGuelle | 323/312 |
| 5,384,548 | 1/1995 | Sakurai et al. | 330/253 |
| 5,392,003 | 2/1995 | Nag et al. | 330/254 |

*Primary Examiner*—Timothy P. Callahan
*Assistant Examiner*—Toan Tran

*Attorney, Agent, or Firm*—Burns, Doane, Swecker & Mathis

[57] ABSTRACT

An all-MOS voltage to current converter is provided in which the resistor of a conventional voltage to current converter is replaced by one or more transistors. The transistors are all subject to the same process variations, solving the tracking problem that can occur using both analog and digital components. An output current is produced as a linear function of an input voltage using first and second MOSFETs by impressing a first voltage related to the input voltage across the first MOSFET transistor and, while operating the first MOSFET in its linear region, producing a first current through the first MOSFET having a magnitude related to the first voltage. The first voltage is then level-shifted by a predetermined voltage to produce a level-shifted voltage. The level-shifted voltage is applied to the second MOSFET, which is operated in its saturated region, producing a second current through the second MOSFET having a magnitude related to the level-shifted voltage. Currents substantially equal to the first and second currents are added together to produce the output current. A voltage to current converter for producing an output current as a linear function of an input voltage therefore includes a first MOSFET, a second MOSFET connected in diode configuration, and circuitry connected to the input voltage and to the first MOSFET for impressing a first voltage related to the input voltage across the first MOSFET. Level shifter circuitry is connected to the first MOSFET and to the second MOSFET for shifting the first voltage by a predetermined voltage to produce a level-shifted voltage and for applying the level-shifted voltage to the second MOSFET. Circuitry is also provided for adding together currents substantially equal to currents produced in the first and second MOSFETs to produce the output current.

11 Claims, 3 Drawing Sheets

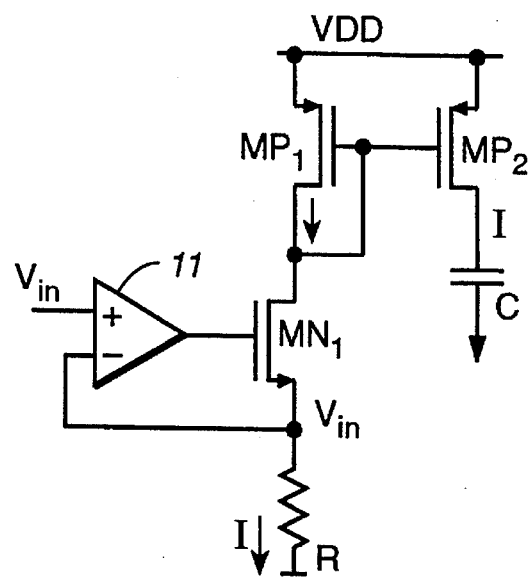
FIG._1
(PRIOR ART)
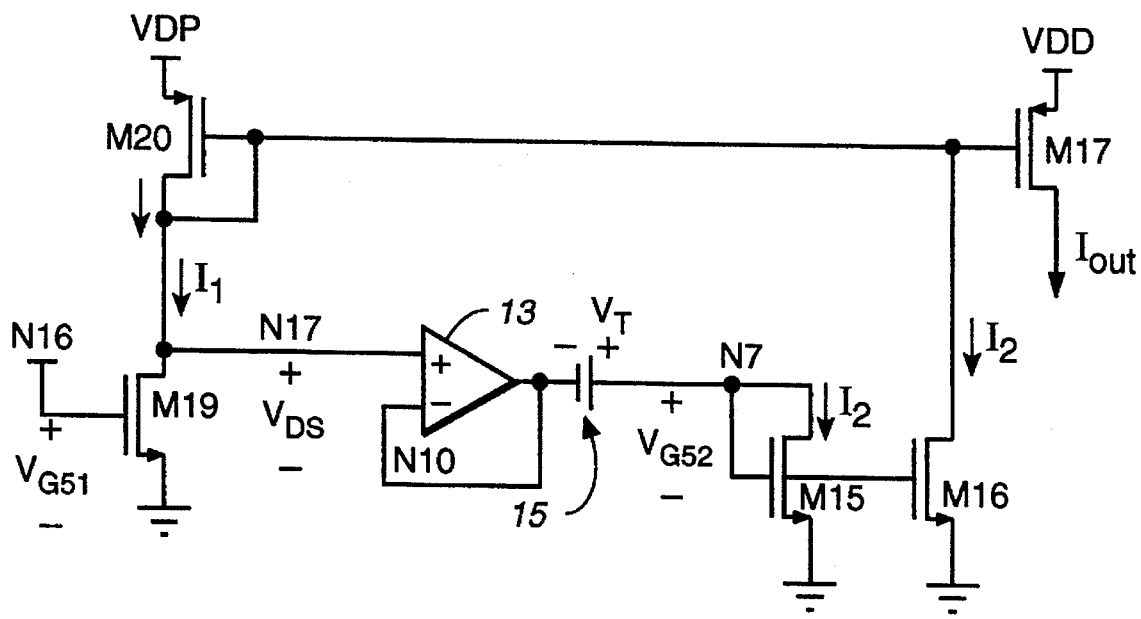
FIG._2

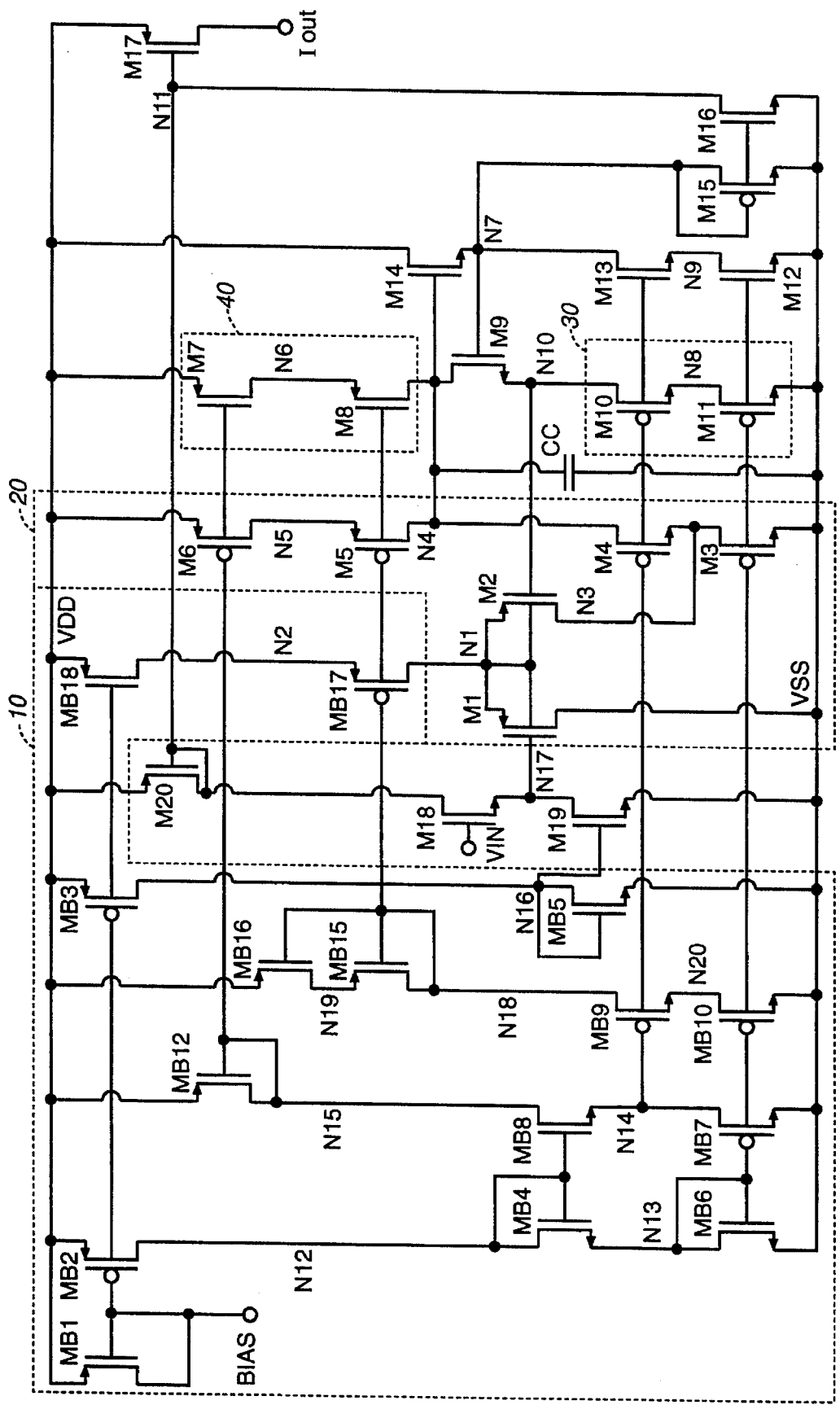
FIG._3

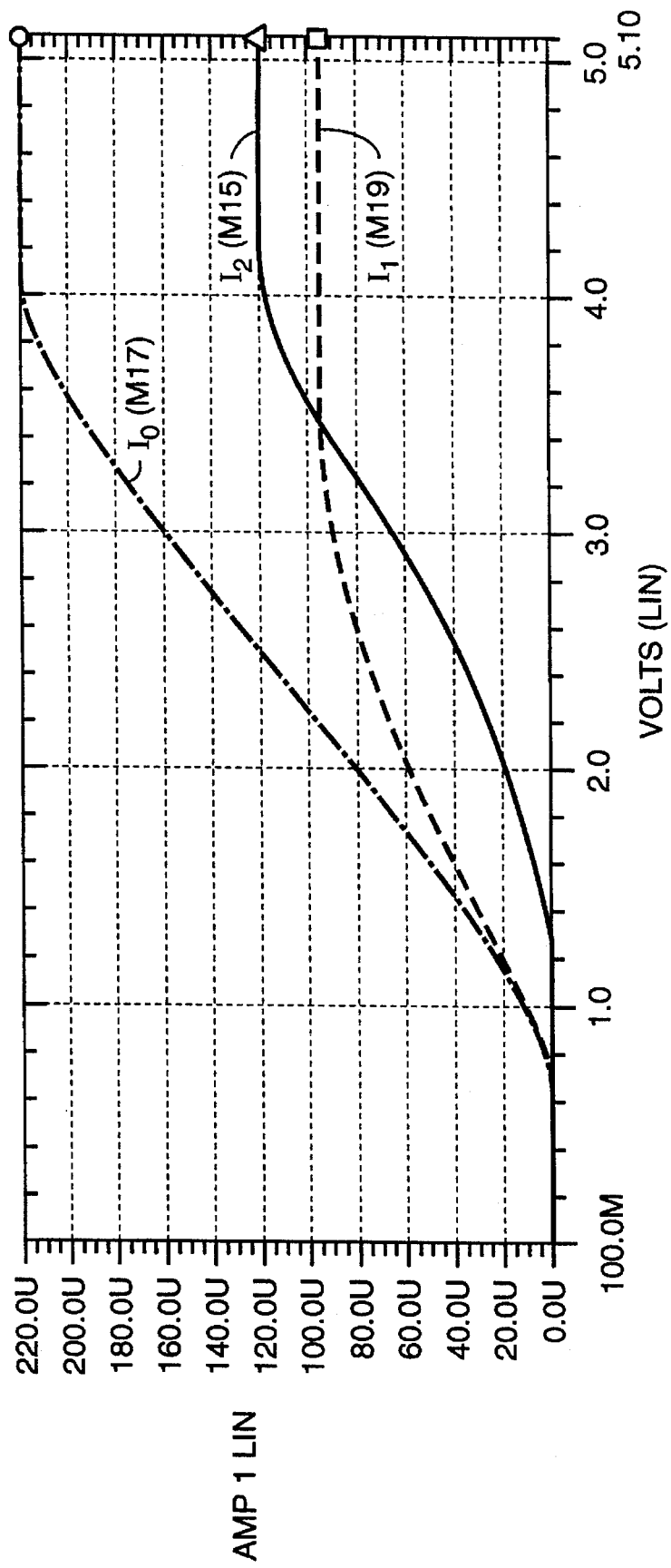
FIG._4

५,५५०,४९५

ALL MOS VOLTAGE TO CURRENT CONVERTER

BACKGROUND OF THE INVENTION

1. Field of the Invention

The present invention relates to voltage to current converters, i.e., circuits that produce an output current as a linear function of an input voltage.

2. State of the Art

In numerous circuit applications, the working medium of the circuit is current whereas the medium used to control the circuit is voltage. Such applications require the use of a voltage to current converter in which a voltage signal is converted to a corresponding current signal in a linear fashion. One such application is a phase locked loop in which a current controlled oscillator is made to be voltage controlled using a voltage to current converter. Phase locked loops are used widely in modern electronic devices of all types.

Referring to FIG. 1, in a conventional voltage to current converter, an input voltage $V_{in}$ is buffered using a buffer amplifier and impressed across a resistor R, a linear element, to produce a current I that is linearly related to the voltage $V_{in}$. More particularly, the voltage $V_{in}$ is connected to the positive input of an op-amp 11. The output of the op-amp is connected to the gate electrode of a MOSFET MN1. The source electrode of the MOSFET MN1 is connected to the negative input of the op-amp 11, forming a negative feedback loop. The resistor R is connected between the source electrode of the MOSFET MN1 and ground. Two additional MOSFETs MP1 and MP2 are connected to form a current mirror that produces two substantially equal currents.

The negative-feedback op-amp 11 drives the MOSFET MN1 such that the voltage at the negative input of the op-amp 11 equals the voltage at the positive input of the op-amp 11, namely $V_{in}$. This occurs when the MOSFET MN1 conducts sufficiently to allow a current $I=V_{in}/R$ to flow from the MOSFET MN1 through the resistor R. An identical current I is produced in the MOSFET MP2 by action of the current mirror. This current is the output current of the voltage to current converter, and might be used to charge a capacitor C, for example. In a phase locked loop, R and C might form part of an oscillator controlled by the current I.

Although the voltage to current converter of FIG. 1 is highly linear in its operation, the trend in present-day MOS circuits is toward all-digital circuits. The analog resistor prevents the voltage to current converter from being realized in an all-digital fashion. Furthermore, the analog resistor does not experience the same process variations as the digital portion of a circuit the voltage to current converter forms a part of. As a result of the lack of tracking between the analog resistor and the digital transistors in the larger circuit, the actual behavior of the circuit may vary from its expected behavior.

For example, in a phase locked loop, because of process variations, the digital transistors in a pre-divider circuit might be "weak", causing operation of the pre-divider to be slowed. Because the analog resistor is not subject to the same process variations, the maximum frequency of the voltage controlled oscillator of the phase locked loop will remain the same. When the frequency of the voltage controlled oscillator exceeds the maximum frequency of the pre-divider, a lockup condition occurs in which the phase locked loop "goes open loop" and cannot be brought back into its normal operation range.

SUMMARY OF THE INVENTION

The present invention, generally speaking, provides an all-MOS voltage to current converter in which the resistor of a conventional voltage to current converter is replaced by one or more transistors. The transistors are all subject to the same process variations, solving the tracking problem described above. More particularly, in accordance with a first embodiment of the invention, an output current is produced as a linear function of an input voltage using first and second MOSFETs by impressing a first voltage related to the input voltage across the first MOSFET transistor and, while operating the first MOSFET in its linear region, producing a first current through the first MOSFET having a magnitude related to the first voltage. The first voltage is then level-shifted by a predetermined voltage to produce a level-shifted voltage. The level-shifted voltage is applied to the second MOSFET, which is operated in its saturated region, producing a second current through the second MOSFET having a magnitude related to the level-shifted voltage. Currents substantially equal to the first and second currents are added together to produce the output current. In accordance with a second embodiment of the invention, a voltage to current converter for producing an output current as a linear function of an input voltage includes a first MOSFET, a second MOSFET connected in diode configuration, and circuitry connected to the input voltage and to the first MOSFET for impressing a first voltage related to the input voltage across the first MOSFET. Level shifter circuitry is connected to the first MOSFET and to the second MOSFET for shifting the first voltage by a predetermined voltage to produce a level-shifted voltage and for applying the level-shifted voltage to the second MOSFET. Circuitry is also provided for adding together currents substantially equal to currents produced in the first and second MOSFETs to produce the output current.

BRIEF DESCRIPTION OF THE DRAWING

The present invention may be further understood from the following description in conjunction with the appended drawing. In the drawing:

FIG. 1 is a simplified schematic diagram of a conventional voltage to current converter;

FIG. 2 is a simplified schematic diagram of a voltage to current converter in accordance with the present invention;

FIG. 3 is a detailed schematic diagram of the voltage to current converter of FIG. 3; and FIG. 4 is a plot of the VI characteristics of the voltage to current converter of FIG. 3, along with plots of currents used to produce the final output current.

DETAILED DESCRIPTION OF THE PREFERRED EMBODIMENTS

The present voltage to current converter may best be appreciated by starting with a mathematical explanation of an underlying principle of the voltage to current converter.

The operation of MOSFETs in both the linear and saturation regions is described by well-known device equations. In the present invention, an output current $I_{out}$ is produced by, in effect, adding a first current $I_1$ produced by a MOSFET operating in the linear region with a second current $I_2$ produced by a MOSFET operating in the saturation region.

The equation for a MOSFET in the linear region (transistor M19 in FIG. 2) is given by $$I_1 = I_{Lin} = \beta_1 \left[ (V_{GS1} - V_T)V_{DS} - \frac{\alpha}{2} V_{DS}^2 \right] \quad \text{(EQ 1)}$$

where $$\alpha = 1 + \frac{\gamma}{2\sqrt{\phi_f + V_{BS}}} \cong 1.2 \text{ to } 1.5 \quad \text{(EQ 2)}$$

and $$\beta_1 = K_p \frac{W_1}{L_1}. \quad \text{(EQ 3)}$$

In Equation 1, $V_T$ is the device threshold voltage and $\beta_1$ is the current gain of transistor M19, in Equation 2, $\lambda$ is the body factor and $\phi_f$ is the surface inversion potential, and in Equation 3, $K_p$ is the conduction factor, $W_1$ is the device channel width and $L_1$ is the device channel length.

The equation for a MOSFET in the saturated region (transistor M15 in FIG. 2) is given by $$I_2 = I_{Sat} = \frac{\beta_2}{2} (V_{GS2} - V_T)^2. \quad \text{(EQ 4)}$$

In Equation 4, $\beta_2$ is the current gain of transistor M15. Adding these two currents together and letting $\beta_2 = \beta_1 \alpha$ and $V_{DS} = V_{GS2} - V_T$, one obtains $$I_{out}I_1 + I_2 = \beta_1 (V_{GS1} - V_T)V_{DS} = GV_{DS}. \quad \text{(EQ 5)}$$

The output current $I_{out}$ therefore becomes a linear function of the voltage $V_{DS}$. If the input voltage $V_{in}$ is impressed across the first MOSFET such that $V_{DS} = V_{in}$, then the output current will be a linear function of the input voltage.

The first condition for the foregoing result to obtain, $\beta_2 = \beta_1 \alpha$, may be satisfied by appropriately scaling and controlling the process parameters of the first and second MOSFETs. The second condition, $V_{DS} = V_{GS2} - V_T$, may be satisfied in a manner set forth in greater detail below.

Conceptually, the all-MOS voltage to current (VTC) circuit of the present invention may be represented as shown in FIG. 2. Reference numbers in FIG. 2 correspond to those used in FIG. 3, which shows the complete VTC circuit in detail.

In FIG. 2, the first MOSFET is identified as M19. The input voltage $V_{in}$, assumed to be equal to $V_{DS}$, varies within a limited range that is encompassed by the linear operating range of the MOSFET M19. Accordingly, the first MOSFET, M19, operates exclusively in the linear region. The current $I_1$ through the first MOSFET is therefore given by Equation 1 above. The voltage $V_{GS1}$ is supplied by a node N16.

The second MOSFET is identified as M15. The second MOSFET is diode-connected such that it operates exclusively in the saturation region. The current $I_2$ through the second MOSFET is therefore given by Equation 3 above.

The condition that $V_{DS} = V_{GS2} - V_T$ (or that $V_{DS} + V_T = V_{GS2}$) is satisfied using a buffer amplifier 13 and a level shifter 15, represented in FIG. 2 as a voltage source. The buffer amplifier 13 replicates the voltage $V_{DS}$ appearing at node N17 without loading the node (i.e., without altering the current $I_1$). The level shifter 15 then adds to the voltage $V_{DS}$ the voltage $V_T$ to produce the voltage $V_{GS2}$. This voltage is then applied to the gate electrode of the second MOSFET M15.

The currants of M19 and M15 are added by the transistors M16, M17 and M20 to generate the output current $I_{out}$. More particularly, the voltage $V_{GS2}$ applied to the transistor M15 is also applied to the transistor M16 such that the two transistors form a current mirror. A current substantially equal to the current 12 that flows through the transistor M15 therefore flows through the transistor M16. The transistor M20 is connected so as to supply both the current $I_2$ flowing through the transistor M16 and the current $I_1$ flowing through the transistor M19. That is, the transistor M20 is diode connected such that its gate and drain electrodes are connected together and are connected to the drain electrode of the transistor M19 and to the drain electrode of the transistor M16. The current that flows through transistor M20 is therefore the sum of the currents $I_1$ and $I_2$, or $I_{out}$ (given by Equation 5 above).

A complete schematic of the all-MOS voltage to current converter is shown in FIG. 3. The transistor M18 is a source follower that forces $V_{in}$ across the transistor M19. The transistors M1–M6 form a simple folded cascode op-amp 20 which forces the voltage $V_{DS19}$ to occur at the source of the transistor M9. The transistors M7, M8, M10, M11 form current sources 30 and 40 that bias M9 such that $V_{GS9} = V_T$. The transistors M12–M14 form a source follower that forces the voltage $V_{DS19} + V_T$ to occur as the voltage $V_{GS}$ across the transistor M15. The operation of the transistors M15, M16, M17, and M20 is as explained in relation to FIG. 2. The remaining transistors constitute a DC biasing circuit 10. Beside settling the voltage $V_{GS}$ of the transistor M19, the bias network 10 facilitates the tracking behavior mentioned previously.

Simulation results for the circuit of FIG. 3 are shown in FIG. 4. In a region of interest from about 0.5 volts to about 3.5 volts, the current $I_1$ through the first MOSFET (M19) exhibits a substantially inverse exponential characteristic whereas the current $I_2$ through the second MOSFET (M15) exhibits a substantially exponential characteristic. The sum of these two currents, $I_{out}$, flows through the transistor M17 and exhibits a substantially linear characteristic throughout the region of interest. As may be seen, $I_{out}$ is a linear function of $V_{in}$.

It will be appreciated by those of ordinary skill in the art that the invention can be embodied in other specific forms without departing from the spirit or essential character thereof. The presently disclosed embodiments are therefore considered in all respects to be illustrative and not restrictive. The scope of the invention is indicated by the appended claims rather than the foregoing description, and all changes which come within the meaning and range of equivalents thereof are intended to be embraced therein.

What is claimed is:

1. A method of producing an output current as a linear function of an input voltage using first and second MOSFETs, comprising the steps of:

a) impressing a first voltage related to the input voltage across the first MOSFET transistor;

b) operating the first MOSFET in its linear region, producing a first current through the first MOSFET having a magnitude related to the first voltage;

c) level shifting the first voltage by a predetermined voltage to produce a level-shifted voltage;

d) applying the level-shifted voltage to the second MOSFET;

e) operating the second MOSFET in its saturated region, producing a second current through the second MOSFET having a magnitude related to the level-shifted voltage; and f) adding together currents substantially equal to the first and second currents to produce the output current.

2. The method of claim 1, wherein the first voltage is the drain to source voltage of the first MOSFET and the level-shifted voltage equals the gate to source voltage of the second MOSFET.

3. The method of claim 2, wherein the predetermined voltage equals a threshold voltage of the first MOSFET.

4. The method of claim 2, wherein the first and second MOSFETs have associated therewith respective parameters $\alpha$ and $\beta$, and wherein the first and second MOSFETs are sized such that $\beta_2=\beta_1\alpha$; wherein $\beta_1$ and $\beta_2$ are current gains of the first and second MOSFETs and $\alpha$ is between 1.2 and 1.5.

5. A voltage to current converter for producing an output current as a linear function of an input voltage, comprising:

a first MOSFET;

a second MOSFET connected in diode configuration;

means connected to the input voltage and to the first MOSFET for impressing a first voltage related to the input voltage across the first MOSFET;

level shifter means connected to the first MOSFET and to the second MOSFET for shifting the first voltage by a predetermined voltage to produce a level-shifted voltage and for applying the level-shifted voltage to the second MOSFET; and means for adding together currents substantially equal to currents produced in the first and second MOSFETs to produce the output current.

6. The apparatus of claim 5, wherein the means for impressing comprises a third MOSFET in source-follower configuration.

7. The apparatus of claim 5, further comprising a buffer amplifier connected between the first MOSFET and the level shifter means.

8. The apparatus of claim 7, wherein the buffer amplifier is a folded cascode amplifier.

9. The apparatus of claim 7, wherein the level shifter means comprises a fourth MOSFET connected by a source electrode to an output of the buffer amplifier and connected by a gate electrode to the second MOSFET and first and second current sources of substantially equal value, the first current source being connected to a drain electrode of the fourth MOSFET and the second current source being connected to the source electrode of the fourth MOSFET.

10. The apparatus of claim 9, wherein the first and second current sources each comprises a pair of series-connected MOSFETS.

11. The apparatus of claim 9, wherein the means for adding together currents comprises:

fifth and sixth MOSFETs connected in a current-mirror configuration, the fifth MOSFET being connected in diode configuration with a drain electrode of the fifth MOSFET being connected to a drain electrode of the first MOSFET via said means for impressing, the sixth MOSFET producing the output current; and a seventh MOSFET having a drain electrode connected to gate electrodes of the fifth and sixth MOSFETs and having a gate electrode connected to a gate electrode of the second MOSFET.

* * * * *